United States Patent
De Lyon et al.

(10) Patent No.: US 11,063,163 B1
(45) Date of Patent: *Jul. 13, 2021

(54) INFRARED PHOTO-DETECTOR WITH LOW TURN-ON VOLTAGE

(71) Applicant: HRL LABORATORIES LLC, Malibu, CA (US)

(72) Inventors: Terence J. De Lyon, Newbury Park, CA (US); Rajesh D. Rajavel, Oak Park, CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/213,213

(22) Filed: Mar. 14, 2014

Related U.S. Application Data

(60) Provisional application No. 61/792,599, filed on Mar. 15, 2013.

(51) Int. Cl.
*H01L 31/0304* (2006.01)
*H01L 31/11* (2006.01)

(52) U.S. Cl.
CPC ........ *H01L 31/03046* (2013.01); *H01L 31/11* (2013.01)

(58) Field of Classification Search
None
See application file for complete search history.

(56) References Cited

U.S. PATENT DOCUMENTS

| | | | |
|---|---|---|---|
| 5,121,181 A * | 6/1992 | Smith, III | B82Y 20/00 257/184 |
| 7,652,252 B1 | 1/2010 | Rajavel et al. | |
| 7,687,871 B2 | 3/2010 | Maimon | |
| 7,795,640 B2 | 9/2010 | Klipstein | |
| 9,146,157 B1 * | 9/2015 | Rajavel | G01J 3/36 |
| 9,444,001 B1 * | 9/2016 | Sharifi | H01L 31/109 |
| 2004/0142504 A1 | 7/2004 | Razeghi | |
| 2005/0045910 A1 | 3/2005 | Taylor et al. | |
| 2006/0043297 A1 | 3/2006 | Ouvrier-Buffet et al. | |
| 2008/0111152 A1 | 5/2008 | Scott et al. | |
| 2009/0134333 A1 * | 5/2009 | Ishibashi et al. | 250/352 |
| 2009/0224229 A1 | 9/2009 | Razeghi | |
| 2009/0256231 A1 * | 10/2009 | Klipstein | 257/441 |

(Continued)

OTHER PUBLICATIONS

Vurgaftman, I. et al., "Band parameters for III—V compound semiconductors and their alloys," *J. Appl. Phys.*, 2001, 89(11), 5815-5875.

(Continued)

*Primary Examiner* — Vincent Wall
(74) *Attorney, Agent, or Firm* — Lewis Roca Rothgerber Christie, LLP

(57) ABSTRACT

An infrared detector and a method for manufacturing it are disclosed. The infrared photo-detector contains a photo absorber layer responsive to infrared light, a first barrier layer disposed on the absorber layer, wherein the first barrier layer substantially comprises AlSb, a second barrier layer disposed on the first barrier layer, wherein the second barrier layer substantially comprises $Al_xGa_{1-x}Sb$ and a contact layer disposed on the second barrier layer.

12 Claims, 7 Drawing Sheets

(56) References Cited

U.S. PATENT DOCUMENTS

2010/0230720 A1* 9/2010 Wicks .......................... 257/188
2012/0145996 A1* 6/2012 Ting ................... H01L 31/1852
                                                          257/21

OTHER PUBLICATIONS

Lee et al., "Subband transitions in dual-band n-B-n InAS/GaSb superlattice infrared photodetector identified by photoresponse spectra," *Appl. Phys. Lett.* 95, 102106 (2009), pp. 102106-1-102106-3.

Maimon, et al., "nBn detector, an infrared detector with reduced dark current and higher operating temperature," *Appl. Phys. Lett.* 89, 151109 (2006), pp. 151109-1-151109-3.

A. Khoshakhlagh et al., "Bias dependent dual band response from InAS/GainSb type II strain layer Superlattice detectors," *Appl. Phys. Lett.* 91, 263504 (2007), pp. 263504-1-263504-3.

Delaunay, et al., "High quantum efficiency two color type-II InAS/GaSb n-i-p-p-i-n photidiodes", Northwestern University, *Appl. Phys. Lett.* 92, 111112 (2008), pp. 111112-1-111112-3.

\* cited by examiner

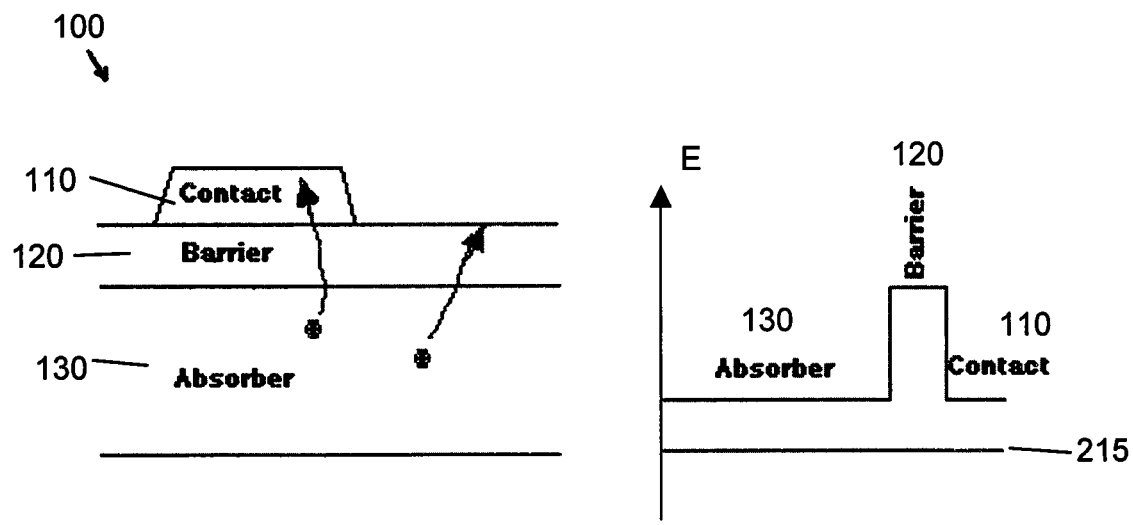
Figure 2A Prior Art
Figure 1 Prior Art
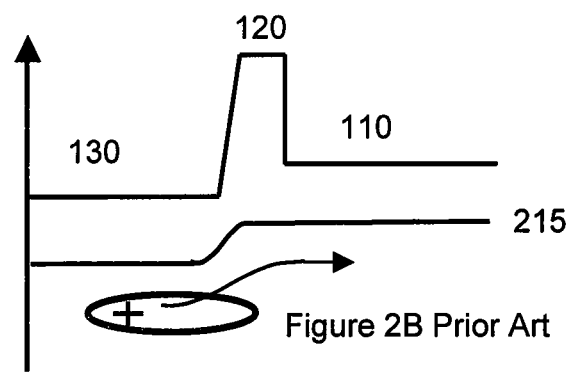
Figure 2B Prior Art

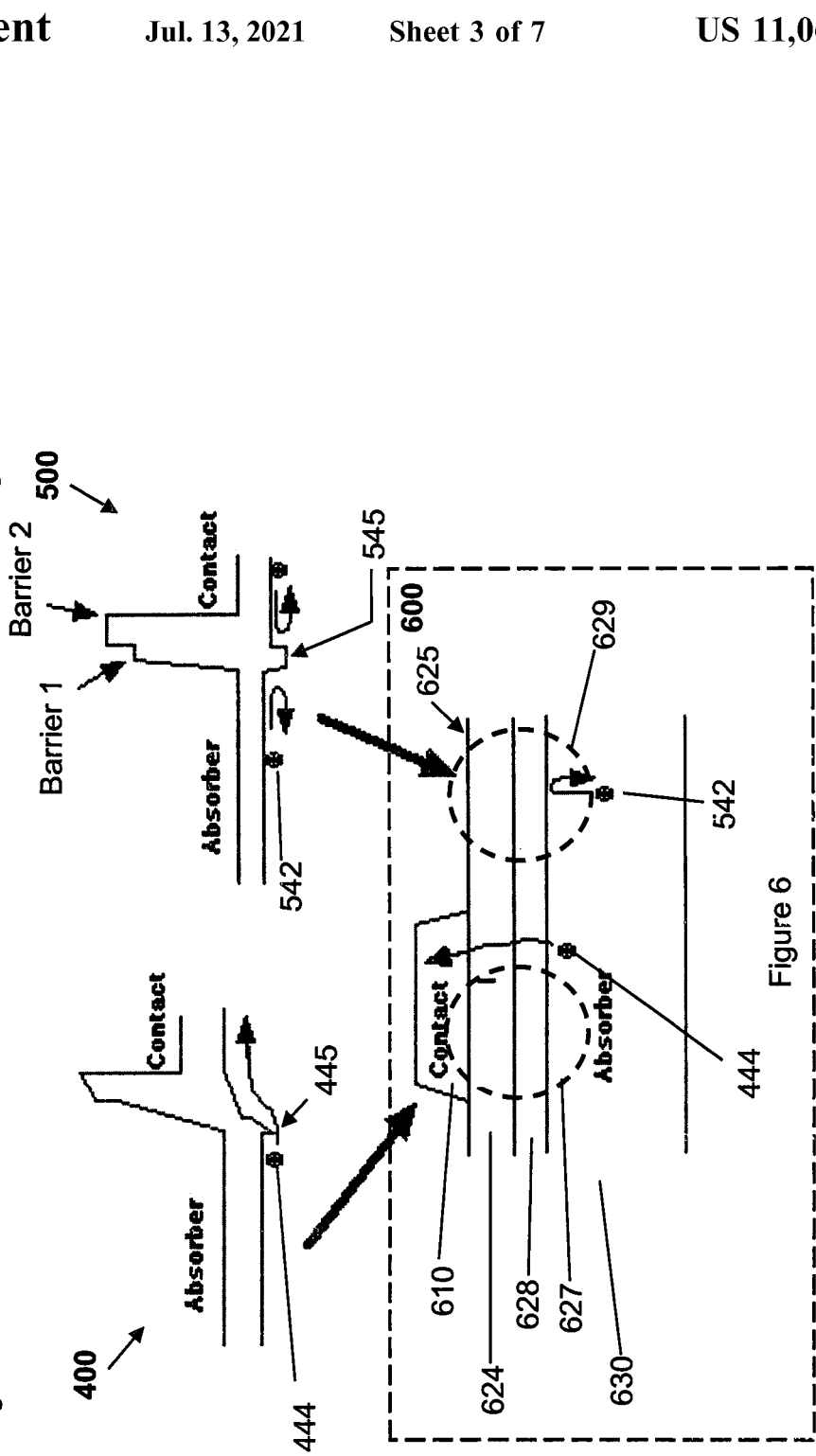

INFRARED PHOTO-DETECTOR WITH LOW TURN-ON VOLTAGE

CROSS REFERENCE TO RELATED APPLICATIONS

This application claims the benefit of U.S. Provisional Application No. 61/792,599, filed on Mar. 15, 2013, which is incorporated herein by reference in its entirety.

STATEMENT REGARDING FEDERALLY SPONSORED RESEARCH OR DEVELOPMENT

The present invention was made with support from the United States Government under Grant number NRO000-11-C-0146 awarded by the United States Government. The United States Government has certain rights in the invention.

FIELD

The present invention relates to an apparatus and method for an infrared photo-detector with low turn-on voltage.

BACKGROUND

Typical designs for an infrared photo-detector for a focal plane array comprise a "barrier" layer of constant alloy composition, whose composition is specifically chosen to produce a near-zero valence-band offset in order to obtain high-efficiency collection of photogenerated minority carriers. The prior-art devices are optimized for high-efficiency collection of photogenerated charge in the bulk of the device, but fail to provide mechanisms to minimize the effects of surface recombination/generation in the periphery outside the influence of the semiconductor contact, which is especially critical for devices utilizing small (<25 μm) pixels, with reduced junction areas, in practical focal-plane arrays. The effect of the surface recombination/generation in the periphery shows up in the dark current. In addition, these prior-art devices rely upon very wide bandgap AlAsSb alloys in the barrier layer, which are difficult to controllably dope, leading to variations in electric field in the narrow-bandgap absorber region of the detector structure, and whose alloy composition is difficult to control in epitaxial growth processes due to the mixed Group V (As and Sb) alloy composition.

Prior-art designs of "nBn" photo-detectors are based on a structure that is summarized in FIG. 1. The device 100 consists of three distinct layers: an "Absorber" layer 130 in which photogeneration of minority carriers occurs due to absorption of incoming photons, a "Barrier" layer 120 that blocks the flow of majority carriers, and a "Contact" layer 110 that facilitates recombination of minority carriers and connection to a metal contact layer to complete an external circuit.

The primary characteristic to this design in FIG. 1 is that the combination of materials for the absorber layer 130 and barrier layer 120 are specifically chosen to provide a flat valence band (215 in FIG. 2A) that offers no barrier to minority carrier transport. A typical semiconducting material combination that meets this requirement, for instance, is $InAs_{0.91}Sb_{0.09}/AlAs_{0.09}Sb_{0.91}$. This design, while presenting no barrier to minority carrier transport from absorber layer 130 to contact layer 110 in the region under the contact 110 mesa, does not prevent minority carrier transport to the free surface of the exposed barrier layer 120 outside the contact layer 110. This lack of a barrier not only allows for recombination of bulk-generated minority carriers, but also does not prevent transport of surface generated minority carriers into the absorber layer 130, which could result in excess dark current.

FIG. 2A shows the energy bandgap of the prior art device without biasing of the contact layer 110 relative to the absorber layer 130. As mentioned above, the valence band 215 under the contact 110 is flat. This is also the valence band present in peripheral regions outside the contact layer 110 because the barrier layer 120 is a semiconductor. FIG. 2B shows the energy bandgap under the contact 110 when the contact 110 is reverse biased. The valence band 215 presents no obstacle to minority carrier transport.

As shown in FIG. 3 for the prior art, a large electric field may be present in the absorber layer 130 due to doping difficulties in the wide-bandgap AlAsSb barrier layer. The field strength is shown by the line 371 in FIG. 3. The resultant band bending in the absorber layer 130 leads to excessive generation-recombination current due to the activation of deep states in the semiconductor bandgap. The wide bandgap (>1.7 eV) of the commonly-employed AlAsSb barrier layer 120 causes difficulty in controlling the electrical properties of the barrier layer 120 via conventional substitutional chemical doping. In particular, it is difficult to dope AlAsSb N-type.

Shimon Maimon in his U.S. Pat. No. 7,687,871, discloses using a single barrier made out of undoped GaAlAsSb material. Although the disclosed photo-detector structure is able to block majority carrier transport, it does not reduce diode turn-on voltage because background doping impurities commonly present in nominally undoped GaAlAsSb epitaxial films can distort the energy bands of the device, producing an unintended valence band energy barrier that interferes with collection of photogenerated carriers, resulting in an excessive turn-on voltage for the detector.

Philip Klipstein, in his U.S. Pat. No. 7,795,640, discloses a photo-detector with a single layer of $Ga_{1-x}Al_xSb_{1-y}As_y$ alloy, doped p-type at a concentration $<1\times10^{15}$ cm$^{-3}$, for blocking majority carrier transport, in conjunction with a p-type GaSb layer for top ohmic contact. However, the $Ga_{1-x}Al_xSb_{1-y}As_y$ alloy does not reduce the turn-on voltage because of the deleterious effect of unintentional background impurities at concentrations in excess of $1\times10^{15}$ cm$^{-3}$.

In view of the limitation in prior art, a need exists for an improved photo-detector with low turn-on voltage.

BRIEF DESCRIPTION OF THE FIGURES

FIG. 1 shows a structure of a prior art infrared photo-detector element of a focal plane array.

FIG. 2A shows the energy band diagram of the structure in FIG. 1 at zero bias.

FIG. 2B shows the energy band diagram of the structure in FIG. 1 at a reverse (negative) bias on the contact.

FIG. 4 shows the energy band diagram of the compound barrier infrared photo-detector according to the principles of the present invention in the region under a contact, with a reverse (negative) bias applied to the contact.

FIG. 5 shows the energy band diagram of the compound barrier infrared photo-detector according to the principles of the present invention in the region not under the contact.

FIG. 6 shows the structure of the compound barrier infrared photo-detector according to the principles of the present invention.

Figure 3:
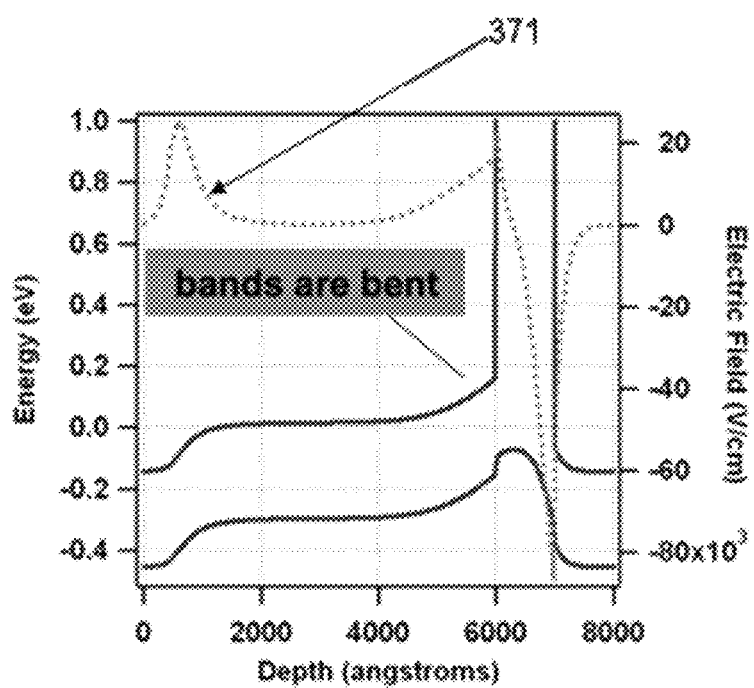
FIG. 3 shows an energy band diagram for prior-art nBn device structure with a doped barrier layer. The dotted curve in the figure represents the electric field, whose value is read off of the right axis.

In the following description, like reference numbers are used to identify like elements. Furthermore, the drawings are intended to illustrate major features of exemplary embodiments in a diagrammatic manner. The drawings are not intended to depict every feature of every implementation nor relative dimensions of the depicted elements, and are not drawn to scale.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Presently disclosed embodiments disclose barrier materials which facilitate photo-detectors with low turn-on voltages. The response of an infrared detector is a function of the reverse bias applied to the photo-detector. It is desirable for the bias required for full response to be as low as possible (generally <500 mV) due to: (a) the limited reverse bias that can be supplied by the Si readout chip that the photo-detector is mated to, and (b) the degradation in noise performance uniformity that can accompany increases in focal-plane array detector bias. Si readout chips generally cannot provide photo-detector reverse bias beyond 500 mV. The photo-detector operating bias for barrier-type photo-detectors is primarily dictated by the matching of the valence band energy levels in the InAsSb absorbing layer and the AlAsSb barrier layer; if the valence band energy levels are not well-aligned, then an energy barrier for hole transport is created, which must be overcome by reverse biasing of the diode.

In the prior art, an $AlAs_{0.08}Sb_{0.92}$ barrier layer was found to work well with $InAs_{0.91}Sb_{0.09}$ absorbing layers used in 4.3 μm cutoff devices grown lattice-matched on GaSb substrates. To address the need for Mid-Wavelength InfraRed (MWIR) focal planes operating out to cutoff wavelengths of 5.2 μm, to exploit the full available MWIR wavelength band, narrower bandgap $InAs_{0.82}Sb_{0.18}$ is employed instead of $InAs_{0.91}Sb_{0.09}$ as the absorbing material. However, the conventional $AlAs_{0.09}Sb_{0.91}$ barrier layer, and related AlAsSb alloy compositions, do not work well with the 5 μm-cutoff $InAs_{0.82}Sb_{0.18}$ absorbing layer alloy, yielding devices with unacceptably high (>500 mV) turn-on voltages.

The presently disclosed embodiments overcomes the deficiency of the prior-art barrier design by implementing an p-type doped $Al_xGa_{1-x}Sb$ alloy, which provides <100 mV turn-on voltages in 5.2 μm cutoff wavelength devices.

By way of example and not limitation, the following embodiments are particularly suited for detecting light in the 0.5 micron to 20 micron wavelengths. Different material combinations will allow other wavelengths of light to be detected.

In some embodiments presently disclosed, a photo-detector 600 shown in FIG. 6, comprises a combination of at least 2 barrier layers 624 and 628. FIG. 4 shows the energy band diagram under reverse bias in the region 627 under the contact 610. FIG. 5 shows the energy band diagram under the contact 610 with zero bias and the same diagram applies in the region 629 outside the contact 610 when the contact 610 is reverse biased. Regions 627 and 629 are indicated in FIG. 6 with a dotted ellipse. As shown in FIG. 4, the barrier layer 628 is designed to present a minority carrier barrier 445 to minority carriers. In the region 627 of the photo-detector 600 under the contact 610, the reverse bias that is applied to the photo-detector 600 under normal operating conditions will remove the minority carrier barrier 445 to minority carrier transport allowing photogenerated minority carriers 444 to be collected with high quantum efficiency or attenuate the minority carrier barrier 445 sufficiently to allow transport. In the regions of the photo-detector 600 outside the contact 610, region 629 in FIG. 6, the energy band diagram 500 of FIG. 5 applies. FIG. 5 shows the minority carrier barrier 545 presented by barrier layer 628 will still be present because no reverse bias is applied in this region 629. This minority carrier barrier 545 improves the performance of the photo-detector 600 by isolating the barrier 624 free-surface 625 from the bulk absorber 630. Minority carriers 542 generated in the absorber layer 630 are blocked by the minority carrier barrier 545, hence are unavailable to recombine at the surface.

In some embodiments, the reverse bias voltage used to achieve the effects described with respect to FIGS. 4 and 5 is a reasonable voltage, typically on the order of one volt. However, depending on the thickness of the layers, any voltage may be reasonable as long as the voltage does not cause an electrical breakdown in the layers of the photo-detector 600.

In some embodiments, the barrier layer 624 comprises p-doped $Al_xGa_{1-x}Sb$ material that acts as a majority-carrier barrier and which minimizes the turn-on voltage of the photo-detector 600. In one embodiment, X is 0.93. In another embodiment, the barrier layer 628 comprises p-doped AlSb material that acts as a surface passivation in the region 629 outside the contact 610 of the photo-detector 600.

Figure 10:
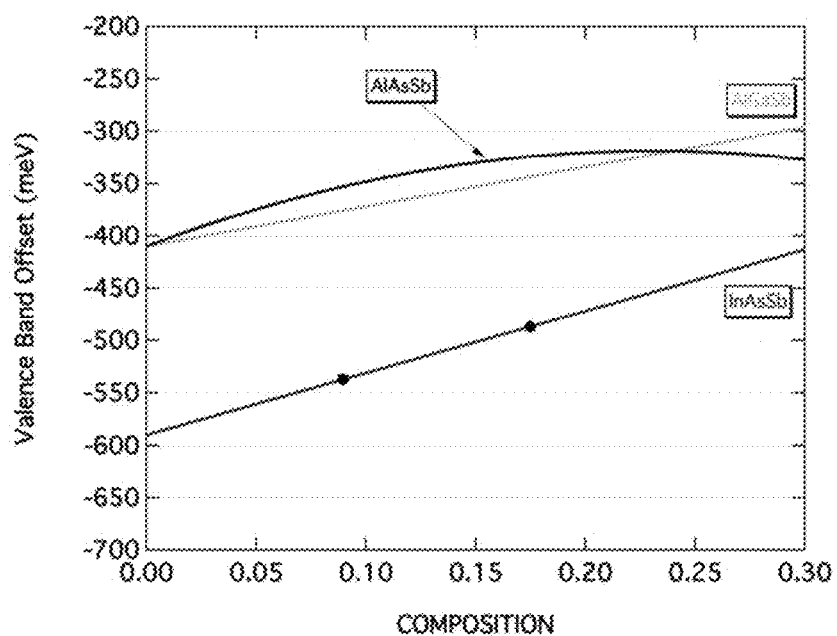
FIG. 10 shows the predicted dependence of valence band energy levels for InAsSb, AlAsSb, and AlGaSb alloy semiconductors.

Based on the available data on the valence band offsets of AlGaSb material, AlAsSb material, and InAsSb material (as shown in FIG. 10), one skilled in the art would have no reason to believe that forming a barrier layer out of AlGaSb material, instead of AlAsSb material, would affect the turn-on voltage of a photodetector.

As shown in FIG. 10, neither AlAsSb nor AlGaSb has a close valence band match to $InAs_{0.82}Sb_{0.18}$. In fact, binary AlSb has the closest valence band match and would be the preferred candidate barrier material from the standpoint of minimizing phot-detector's turn-on voltage. Addition of either As or Ga to AlSb forces the alloy valence band higher, away from the valence band of $InAs_{0.82}Sb_{0.18}$. This well-known data suggests no advantage for AlGaSb over AlAsSb as a barrier material for 5.2 μm cutoff detectors. The presently disclosed photo-detectors run contrary to accepted data on the electronic properties of AlAsSb and AlGaSb. The accepted data is described in more detail by I. Vurgaftman, et al., J. Appl. Phys. 89(11), 5815 (2001) which is incorporated herein by reference.

Figure 11:
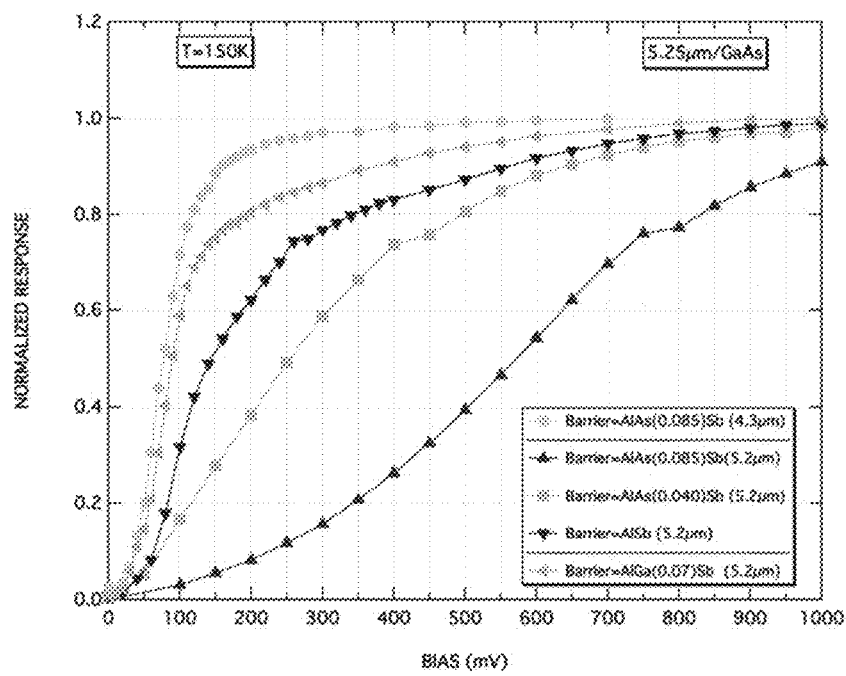
FIG. 11 shows experimental infrared detector photo-response data as a function of applied bias for detectors with various Barrier materials.

The turn-on characteristics of the photo-detectors fabricated with either AlAsSb material for a barrier or AlGaSb material for a barrier are summarized in FIG. 11.

As shown in FIG. 11, while $AlAs_{0.09}Sb_{0.91}$ performs well as a barrier material for 4.3 μm cutoff photo-detectors having $InAs_{0.91}Sb_{0.09}$ absorbing layers, the turn-on characteristics of 5.2 μm cutoff photo-detectors having $InAs_{0.82}Sb_{0.18}$ absorbers are degraded with AlSb, $AlAs_{0.04}Sb_{0.96}$, and $AlAs_{0.09}Sb_{0.91}$ barriers. Only the 5.2 μm cutoff device with an $Al_{0.93}Ga_{0.07}Sb$ barrier has a turn-on voltage that is comparable to the 4.3 μm detector with the conventional $AlAs_{0.09}Sb_{0.91}$ barrier.

As shown in FIG. 11, utilization of the alternative double-barrier $Al_xGa_{1-x}Sb/AlSb$ design as presently disclosed allows the favorable turn-on characteristics of 4.3 μm cutoff photo-detectors, for which AlAsSb performs acceptably as a barrier material, to be extended to 5.2 μm cutoff photo-detectors, for which AlAsSb does not work well as a barrier material.

In one embodiment, the contact 610 comprises p-type doped InAsSb material. In another embodiment, the absorber layer 630 comprises n-type doped InAsSb material.

The embodiments presently disclosed block the migration of minority carriers outside the region influenced by a biased contact 610 in FIG. 6, yet the same minority carrier barrier 545 is absent or attenuated in the region under the contact 610 when a reverse bias is applied to contact 610 where the minority carrier barrier 445 is operative. The embodiment of the photo-detector 600 engineers the energy band diagram of the photo-detector 600 such that the minority carrier barrier 445 is small enough to allow minority carriers to tunnel through the minority carrier barrier 445 when a reverse bias is applied to the contact layer, yet large enough in the lateral regions outside the contact area to block minority carrier transport.

Figure 7:
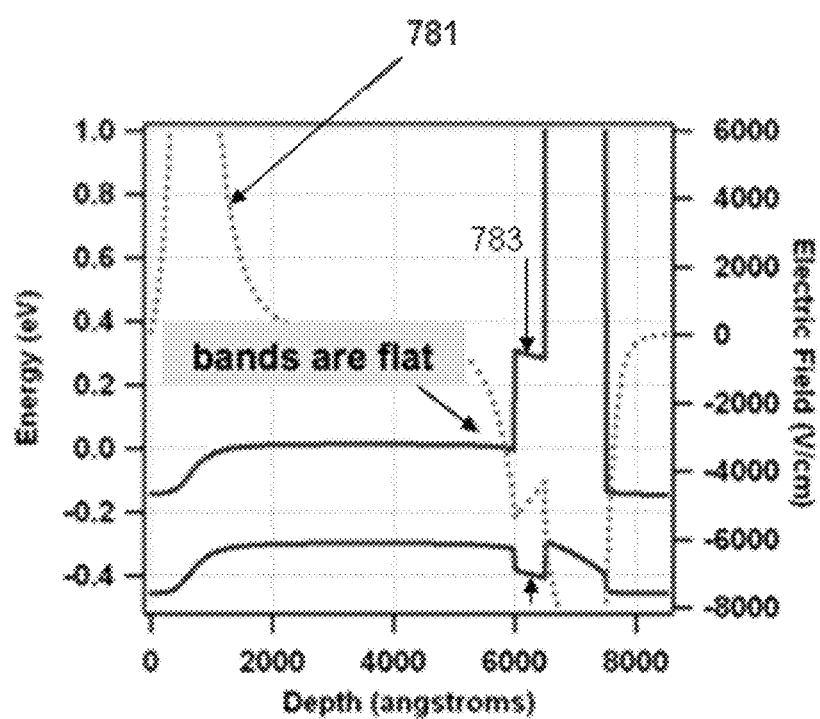
FIG. 7 shows energy band diagram for compound barrier infrared photo-detector structure with optimally-doped barrier layer. The dotted curve in the figure represents the electric field, whose value is read off of the right axis.

In some embodiments, implementation of at least 2 barrier layers 624 and 628 in the presently disclosed photo-detector 600 allows for use of an alternative narrower-bandgap interfacial barrier materials that can be selected for their favorable valence band offset with respect to the absorber and for its ability to be controllably doped by conventional substitutional doping. FIG. 7 illustrates the benefit of implementing at least 2 barrier layers 624 and 628 in the presently disclosed photo-detector 600. The electric field strength is shown as the line 781 in FIG. 7. FIG. 7 shows the electric field strength 781 at the absorber/barrier interface is on the order of 8000 V/cm in the barrier region while FIG. 3 shows the corresponding electric field strength 371 is on the order of 20,000 V/cm. FIG. 7 also shows the bandgap 783 of an interfacial barrier layer 628 disposed on the absorber layer is approximately 0.7 electron volts (ev). In some embodiments, an interfacial barrier layer 628 bandgap 783 is less than 1.5 ev.

In one embodiment, the absorber layer 630 may comprise a graded absorber layer 630 as described in U.S. Pat. No. 7,652,252 issued 26 Jan. 2010 titled "Electronically Tunable and Reconfigurable Hyperspectral Photon Detector", incorporated herein by reference.

In addition to the surface-passivation benefit, the compound-barrier design presently disclosed offers the additional benefit of allowing the use of semiconductor materials with narrower bandgap, which improves the control of doping in the barrier layers 628, 624. In FIG. 3, the energy band diagram for a prior-art nBn device is displayed, which illustrates a limitation in the prior art design if the barrier layer cannot be doped at a level for a minimum electric field in the absorber layer.

The ability to controllably dope the barrier layer is critical for control of the electric field in the absorber layer of the device. With proper selection of the barrier doping, the electric field in the absorber layer can be minimized, which eliminates substantially all generation-recombination current contribution to the dark current. Specifically, the absorber layer in the vicinity of the barrier layer has to have a low electric field strength to minimize depletion of the absorber layer. Preferably the electric field strength is less than 10,000 v/cm. Depletion of the absorber layer can result in increased dark current (generation-recombination current).

Figure 8:
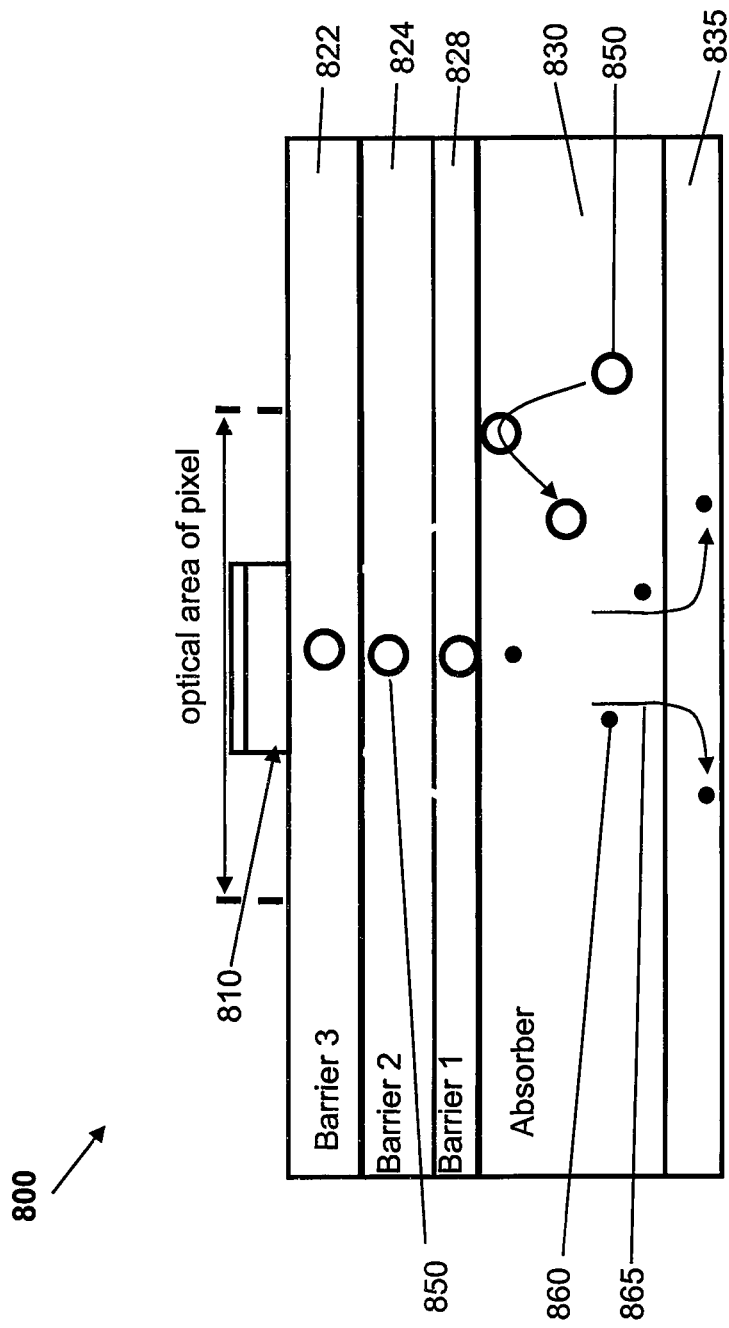
FIG. 8 illustrates a compound barrier infrared photo-detector with three barrier layers.

In an alternative embodiment illustrated in FIG. 8, a photo-detector 800 comprises 3 different layers 828, 824 and 822. The first barrier 828, adjacent to the absorber 830 is doped p-type to ensure flat band characteristics in the absorber 830. This barrier 828 can optionally have a minority carrier barrier 445 (shown in FIG. 4) produced by a valence band offset in the case of a N-type absorber 830, or have a minority carrier barrier 445 (shown in FIG. 4) produced by a conduction band offset in the case of a p-type absorber 830. FIG. 8 also illustrates the migration of minority carriers 850 under the contact 810. The blocking of minority carriers 850 outside the contact 810 is also shown. The majority carriers 860 migrate along the path 865 as shown in FIG. 8.

The second barrier layer 824 is adjacent to the first barrier layer 828, with a large (>10 kT) conduction band offset as compared to the absorber layer 830, and serves to block the majority carriers in the absorber layer 830 and the contact layer 810.

In one embodiment, the barrier layer 824 comprises p-doped $Al_xGa_{1-x}Sb$ material that acts as a majority-carrier barrier and which minimizes the turn-on voltage of the photo-detector 800. In one embodiment, X is 0.93. In another embodiment, the barrier layer 828 comprises p-doped AlSb material that acts as a surface passivation in the region outside the contact 810 of the photo-detector 800.

In one embodiment, the contact 810 comprises p-type doped InAsSb material. In another embodiment, the absorber layer 830 comprises n-type doped InAsSb material.

The third barrier layer 822, which is located between the second barrier layer 824 and the contact layer 810, has a chemical composition such that it is stable and not prone to oxidation or degradation when exposed to the ambient air, and serves to cap and protect the second barrier layer 824. Exemplary materials for the third barrier layer 822 are Alloys with percentage Aluminum cation fraction less than 80%. The third barrier layer 822 provides better stability to oxygen in the environment as compared to alloys with 100% Al. In one embodiment, the third barrier material 822 is $A_{0.7}In_{0.3}As_{0.4}Sb_{0.6}$ with a bandgap of 1.5 eV at 200 degrees K, a minority carrier barrier 445 (shown in FIG. 4) with respect to an $InAs_{0.91}Sb_{0.09}$ absorber layer 830 at 200K of 0.075 eV, 0.6% mismatch in lattice constant with respect to the $InAs_{0.91}Sb_{0.09}$ absorber layer 830, and a critical layer thickness with respect to the $InAs_{0.91}Sb_{0.09}$ absorber layer 830 of approximately 15 nm.

In some embodiments, the second barrier layer 824 is doped p-type. In one embodiment, the second barrier layer 824 is deliberately doped to a value slightly higher than the background doping of the third barrier layer 822. This predictable doping of the second barrier layer 824 enables one to design the doping level in the first barrier layer 828 to ensure flat-band conditions in the absorber layer 830. In one embodiment, the bandgap of the third barrier layer 822 may be smaller than that of the second barrier layer 824. In another embodiment, third barrier layer 822 can optionally have a minority carrier barrier 445 produced by a valence band offset as compared to the absorber layer 830 or the second barrier layer 824, in the case of an N-type absorber layer 830, or have a minority carrier barrier 445 produced by a conduction band offset in the case of an P-type absorber layer 930. One or more layers, 828, 824, 822 of the compound barrier may be either lattice matched or lattice mismatched and grown to a thickness less than the critical layer thickness in order to prevent the creation of dislocations.

Figure 9:
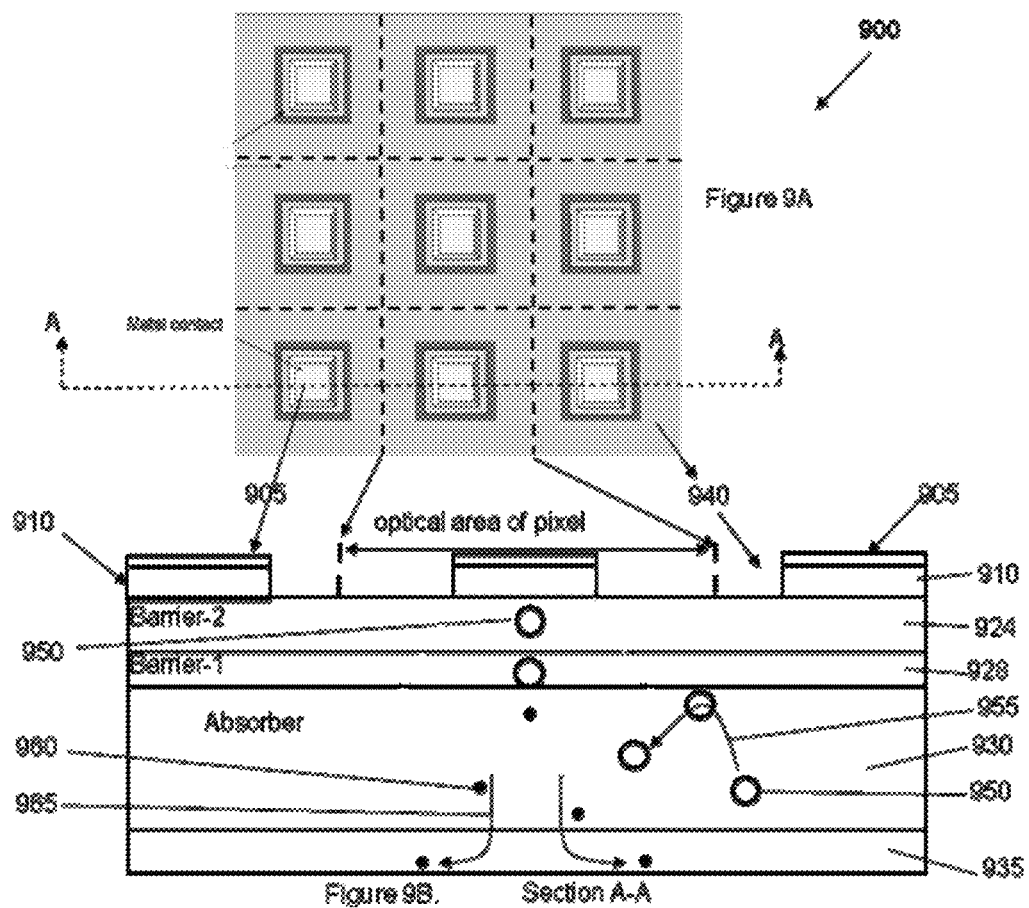
FIG. 9A shows a 3 by 3 pixel focal plane array from the top comprising a plurality of compound barrier infrared photo-detectors.
FIG. 9B shows a side view of the focal plane array in FIG. 9A along section line A-A, enlarged.

In some embodiments, the compound barrier infrared photo-detector 600 of FIG. 6 may be fabricated in an array of multiple compound barrier infrared photo-detectors. FIG. 9A shows a top view of an array of compound barrier infrared photo-detectors where the contact layer 910 for a pixel covers less than the entire area defining a pixel. A side view of section A-A in FIG. 9A is shown in FIG. 9B. Contact layer 910 occupies less than the entire area of a pixel and is topped with a metal ohmic contact 905. The region 940 between contact layers 910 is shown as exposed in FIG. 9B although in an alternative embodiment the region 940 may comprise a passivation or protection material. Typically the entire pixel area is not covered by the contact layer 910. The barrier layers 924 and 928 are as described for 624 and 628, respectively, for FIG. 6. Similarly the absorber layer 930 and contact layer 910 correspond to layers 630 and 610 in FIG. 6 respectively. FIG. 9B illustrates the location of Window layer 935.

FIG. 9B also illustrates the migration of minority carriers 950 under the contact 910, for example, per the band energy diagram 400 in FIG. 4. The blocking of minority carriers 950 outside the contact 910 is also shown. This behavior is, for example, per the band energy diagram 500 in FIG. 5. The majority carriers 960 migrate along the path 965 as shown in FIG. 9B.

In another embodiment shown in FIGS. 9B and 8, a window layer 935/835 located adjacent to the absorber layer 930/830 on the light incidence side of the absorber layer 930/830, opposite the barrier layer 928/828, may be added. The window layer 935/835 is transparent to all wavelengths of light the detector is designed to detect, may have an offset in the valence or conduction band as compared to the absorber layer 930 that serves to block minority carriers generated in the absorber layer 930 from recombining at the light incident surface. This valence or conduction band offset produces the minority carrier barrier 545 in FIG. 5. Typical thicknesses of the window layer 935/835 are on the order of 100 nm. The window layer 935/835 may comprise the same material as the absorber layer 930/830 but is heavily doped. For an N doped absorber layer 930/830 the window layer 935/835 is N+ doped at a concentration of 1.0E17 to 1.0E18 per $cm^3$. For a P type absorber layer 930/830 the window layer 935/835 is heavily doped P type with a concentration of 1.0E17 to 1.0E18 per $cm^3$.

In one embodiment, the barrier layer 924 comprises p-doped $Al_xGa_{1-x}Sb$ material that acts as a majority-carrier barrier and which minimizes the turn-on voltage of the photo-detector 900. In one embodiment, X is 0.93. In another embodiment, the barrier layer 928 comprises p-doped AlSb material that acts as a surface passivation in the region outside the contact 910 of the photo-detector 900.

In one embodiment, the contact 910 comprises p-type doped InAsSb material. In another embodiment, the absorber layer 930 comprises n-type doped InAsSb material.

The band energy diagrams 400 (shown in FIG. 4) and 500 (shown in FIG. 5) are for a device with an N-type absorber. As noted earlier, depending on the materials used for the contact, absorber and barrier layers, a pBp device based on a P-type absorber may be constructed. In such an embodiment, the principles described above are the same while the polarity or shape of the band energy diagram will change as familiar to those skilled in the art know.

Typical techniques to form the infrared photo-detector devices 600, 900 and 800 include Molecular Beam Epitaxy.

While several illustrative embodiments of the invention have been shown and described, numerous variations and alternative embodiments will occur to those skilled in the art. Such variations and alternative embodiments are contemplated, and can be made without departing from the scope of the invention as defined in the appended claims.

As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The foregoing detailed description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "step(s) for . . . ."

What is claimed is:
1. An infrared photo-detector comprising:
   a photo absorber layer responsive to infrared light;
   a barrier layer comprising:
      a first barrier layer disposed directly on and in contact with the photo absorber layer, wherein the first barrier layer substantially comprises AlSb; and a second barrier layer disposed on the first barrier layer, wherein the second barrier layer comprises $Al_xGa_{1-x}Sb$, where x is from 0.70 to 0.95; and a contact layer disposed on the second barrier layer.

2. The infrared photo-detector of claim 1, wherein x is 0.93.

3. The infrared photo-detector of claim 1, wherein the contact layer comprises InAsSb.

4. The infrared photo-detector of claim 1, wherein the photo absorber layer substantially comprises InAsSb.

5. The infrared photo-detector of claim 1, wherein the first barrier layer is in direct contact with the second barrier layer.

6. An infrared photo-detector comprising:

a photo absorber layer responsive to infrared light, a barrier layer consisting of:

a first barrier layer disposed directly on and in contact with the photo absorber layer; and a second barrier layer disposed on the first barrier layer; and a contact layer disposed on the second barrier layer, wherein the second barrier layer is selected to allow the infrared photo-detector to operate at less than 100 millivolts wherein the first barrier layer substantially comprises AlSb, and wherein the second barrier layer comprises $Al_{0.93}Ga_{0.07}Sb$.

7. The infrared photo-detector of claim 6, wherein the contact layer comprises InAsSb.

8. The infrared photo-detector of claim 6, wherein the photo absorber layer substantially comprises InAsSb.

9. The infrared photo-detector of claim 6, wherein the first barrier layer is in direct contact with the second barrier layer.

10. A compound barrier infrared photo-detector comprising:

a photo absorber layer responsive to infrared light;

a barrier layer comprising:

a first barrier layer disposed directly on and in contact with the photo absorber layer, wherein the first barrier layer substantially comprises AlSb;

a second barrier layer disposed on the first barrier layer, wherein the second barrier layer substantially comprises $Al_xGa_ySb$, where x is from 0.70 to 0.95 and y is from 0.05 to 0.30; and a third barrier layer of a third semiconductor material disposed on the second barrier layer, the third semiconductor material comprising an aluminum alloy with aluminum cation fraction less than 80%; and a contact layer disposed on the third barrier layer.

11. The infrared photo-detector of claim 10, wherein the first barrier layer is in direct contact with the second barrier layer.

12. The infrared photo-detector of claim 10, wherein the third barrier layer is in direct contact with the second barrier layer.

* * * * *